(12) United States Patent
Yu et al.

(10) Patent No.: US 9,202,792 B2
(45) Date of Patent: Dec. 1, 2015

(54) STRUCTURE AND METHOD OF PROVIDING A RE-DISTRIBUTION LAYER (RDL) AND A THROUGH-SILICON VIA (TSV)

(71) Applicant: Taiwan Semiconductor Manufacturing Company Limited, Hsinchu (TW)

(72) Inventors: Shao-Chi Yu, Hsinchu (TW); Chia-Ming Hung, Taipei (TW); Hsiang-Fu Chen, Hsinchu County (TW); Wen-Chuan Tai, Hsinchu (TW); Hsin-Ting Huang, Taoyuan County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/261,793

(22) Filed: Apr. 25, 2014

(65) Prior Publication Data

US 2015/0311168 A1    Oct. 29, 2015

(51) Int. Cl.
  *H01L 21/311* (2006.01)
  *H01L 23/00* (2006.01)
(52) U.S. Cl.
  CPC ............... *H01L 24/03* (2013.01); *H01L 24/16* (2013.01); *H01L 24/81* (2013.01); *H01L 2224/0231* (2013.01); *H01L 2224/1601* (2013.01)
(58) Field of Classification Search
  CPC .................... H01L 21/02063; H01L 21/2633; H01L 21/0228; H01L 21/28079; H01L 21/762; H01L 21/76205; H01L 21/7683; H01L 21/76831; H01L 21/76202; H01L 21/76224; H01L 21/52105; H01L 21/31658; H01L 21/8238; H01L 23/53271; H01L 23/4951; H01L 23/3114; H01L 23/53233; H01L 23/53219
  USPC ............ 438/700, 279, 680, 712, 50, 52, 199, 438/294, 296, 297, 430, 439, 446, 684, 687, 438/688; 257/E21.006, E21.027, E21.126, 257/E21.127, E21.17, E21.182, E21.305, 257/E21.545, E21.546
  See application file for complete search history.

(56) References Cited

U.S. PATENT DOCUMENTS

| 5,739,579 | A  | * | 4/1998 | Chiang et al. | ................. | 257/635 |
| 8,513,767 | B2 | * | 8/2013 | Kotlanka et al. | ............. | 257/506 |
| 8,835,291 | B2 | * | 9/2014 | Huang et al. | ................. | 438/585 |

* cited by examiner

*Primary Examiner* — David Nhu
(74) *Attorney, Agent, or Firm* — Jones Day (57) ABSTRACT

A method of providing a redistribution layer (RDL) and a through-silicon via (TSV) for a semiconductor package is disclosed. The method comprises preparing a wafer for bonding to a semiconductor package. The wafer comprises a low resistance substrate containing a RDL and a TSV for making an input/output (I/O) connection point of the semiconductor package available at another location. The RDL comprises a conduction path through the low resistance substrate that is bounded on two sides by an isolation trench. The TSV is bounded by the isolation trench and the RDL. Preparing the wafer for bonding may comprise preparing the isolation trench that bounds the conduction path for the RDL through the low resistance substrate and bounds a vertical conduction path in a pillar for the TSV in the low resistance substrate, filling the isolation trench with isolation trench material, and preparing a wafer bonding surface.

18 Claims, 15 Drawing Sheets

STRUCTURE AND METHOD OF PROVIDING A RE-DISTRIBUTION LAYER (RDL) AND A THROUGH-SILICON VIA (TSV)

BACKGROUND

The technology described in this patent document relates generally to 3-D semiconductor devices and more specifically to a structure and methods for providing a re-distribution layer and a through-silicon via.

Scaling of semiconductor devices has enabled continued improvement in speed, performance, density, and cost per unit function of integrated circuits over the past few decades. Improvements to the process for fabricating a re-distribution layer and a through-silicon via can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Described herein are methods that can be used to fabricate a through-silicon via (TSV) with a small via footprint, and also to fabricate a TSV and a re-distribution layer (RDL) at the same time. These methods could be utilized in wafer level chip scale package (WLCSP) technology to lower fabrication costs and achieve a smaller die size.

In many systems the minimal size of an electroplating TSV is constrained by the via depth. Whenever a deeper via is desired, the size of the TSV increases. Also, in these systems the RDL may not be integrated with TSV technology. In these systems, extra processes and masks may be used to fabricate a RDL.

According to the methods described herein, a TSV is formed by etching an isolation trench that encloses a low resistance Si-pillar and/or a RDL as an electrical conduction path and filling the isolation trench with isolation trench material such as poly-silicon and an oxide for following back-end processes. A TSV constructed using these techniques may result in a smaller TSV size for the same TSV depth as compared to a TSV constructed using other techniques. Also, a RDL and a TSV may be fabricated simultaneously using the methods described herein.

Figure 1A:
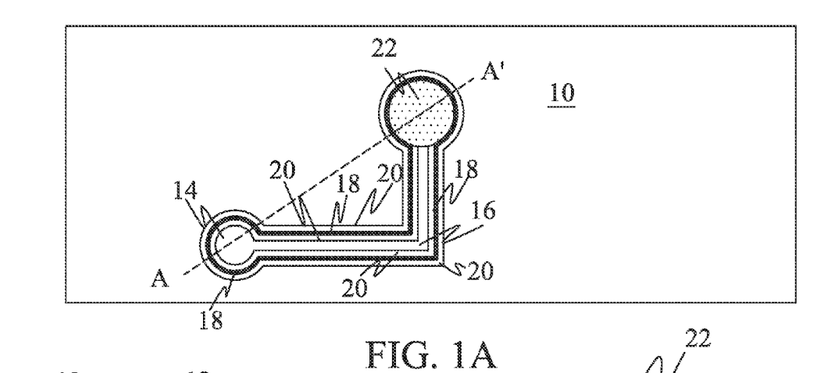
FIG. 1A depicts a bottom view of an example cap wafer that can be bonded to a semiconductor device to provide a through-silicon via (TSV) and a re-distribution layer (RDL), in accordance with some embodiments.
Figure 1B:
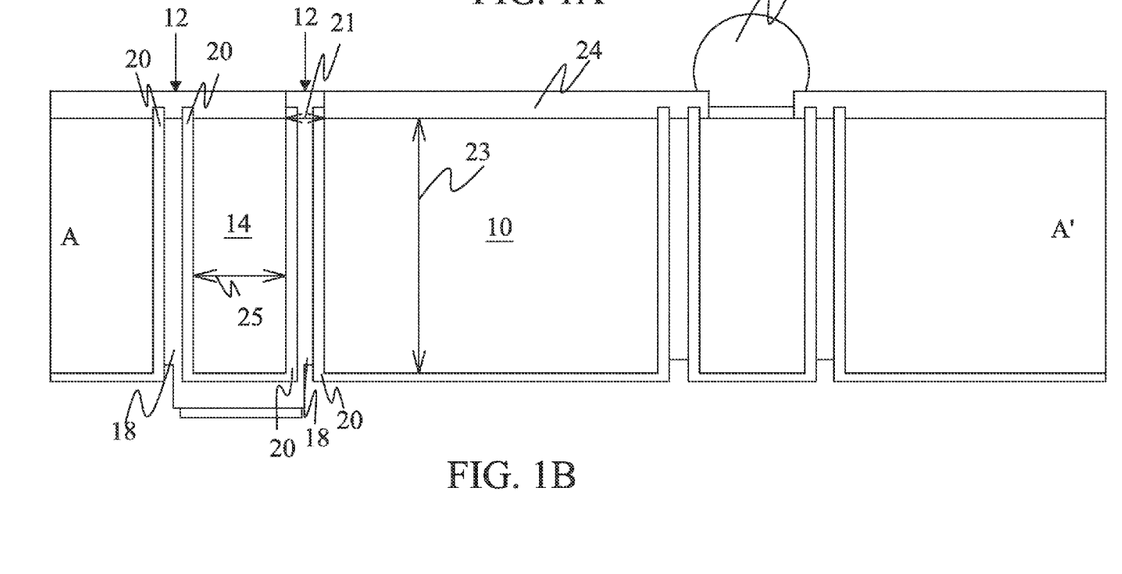
FIG. 1B depicts a side view of the cap wafer of FIG. 1A.

FIG. 1A depicts a bottom view of a cap wafer 10 (e.g., a low resistance silicon (Si) substrate) that can be bonded to a semiconductor device to provide a through-silicon via (TSV) with a small via footprint and to provide a re-distribution layer (RDL). The TSV and RDL cooperate to make an input/output (I/O) connection point of a semiconductor device available at another location. FIG. 1B depicts a side view of the cap wafer 10 along cutline A-A'. The TSV and RDL may be fabricated at the same time using the techniques disclosed herein. The depicted structure may be utilized in wafer level chip scale package (WLCSP) technology to lower fabrication costs and to achieve a smaller die size.

The depicted structure may be formed by etching an isolation trench 12 in the low resistance Si wafer 10. The isolation trench may enclose a low resistance pillar 14 (e.g., Si-pillar) as a TSV electrical conduction path in a low resistance substrate, a RDL 16 as an electrical conduction path in a low resistance substrate, or both. The isolation trench 12 in this example is filled with poly-Si 18 and an oxide 20 (e.g., $SiO_2$) to isolate the TSV 14 and the RDL conduction path 16 within the cap wafer 10. A solder bump 22 (made from, e.g., a Tin-based alloy) may be provided on the bottom surface of the low resistance Si-pillar 14 of the cap wafer 10 to provide a connection point to a system level printed circuit board (PCB) to which the cap wafer 10 may be mounted after chip dicing. A dielectric layer 24 may be provided on other parts of the bottom surface of the cap wafer 10 to provide isolation from a system level PCB to which the cap wafer 10 may be mounted. In the example, of FIGS. 1A and 1B, the trench has a diameter 21 of 9.3 μm (1.5 μm ox+6.3 μm poly+1.5 μm ox) and a height 23 of 150 μm, and the TSV pillar 14 has a diameter 25 greater than 15 μm.

Figure 2:
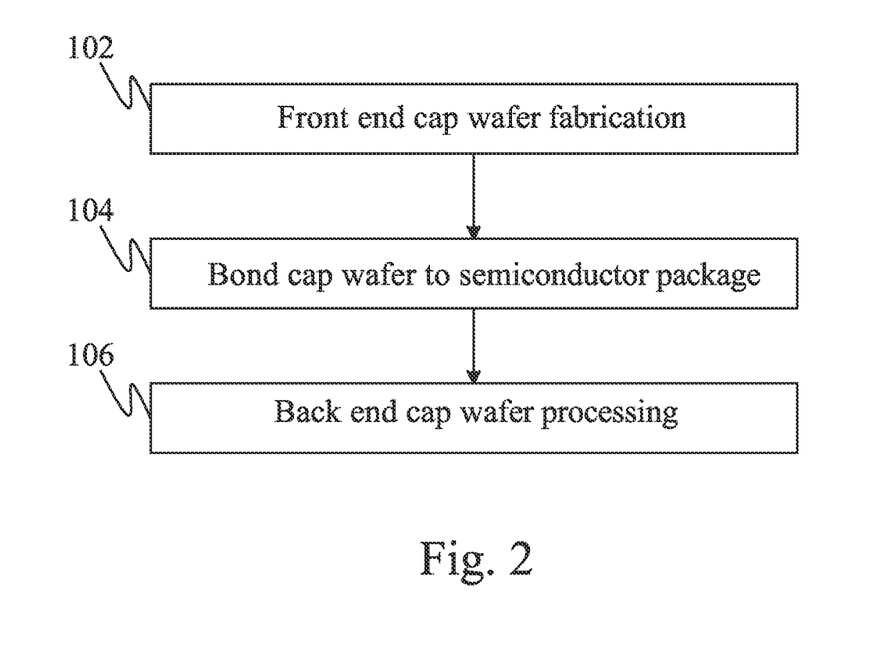
FIG. 2 is a process flow chart depicting an example method for generating a semiconductor structure having a TSV and a RDL fabricated together in a low resistance wafer that is bonded to an underlying semiconductor device, in accordance with some embodiments.

FIG. 2 is a process flow chart depicting an example method for generating a semiconductor structure having a TSV and a RDL fabricated together in a low resistance wafer that is bonded to an underlying semiconductor device. The example method comprises front end cap wafer fabrication operations (operation 102), bonding the cap wafer to a semiconductor package (operation 104), and backend cap wafer processing operations (operation 106).

Figure 3:
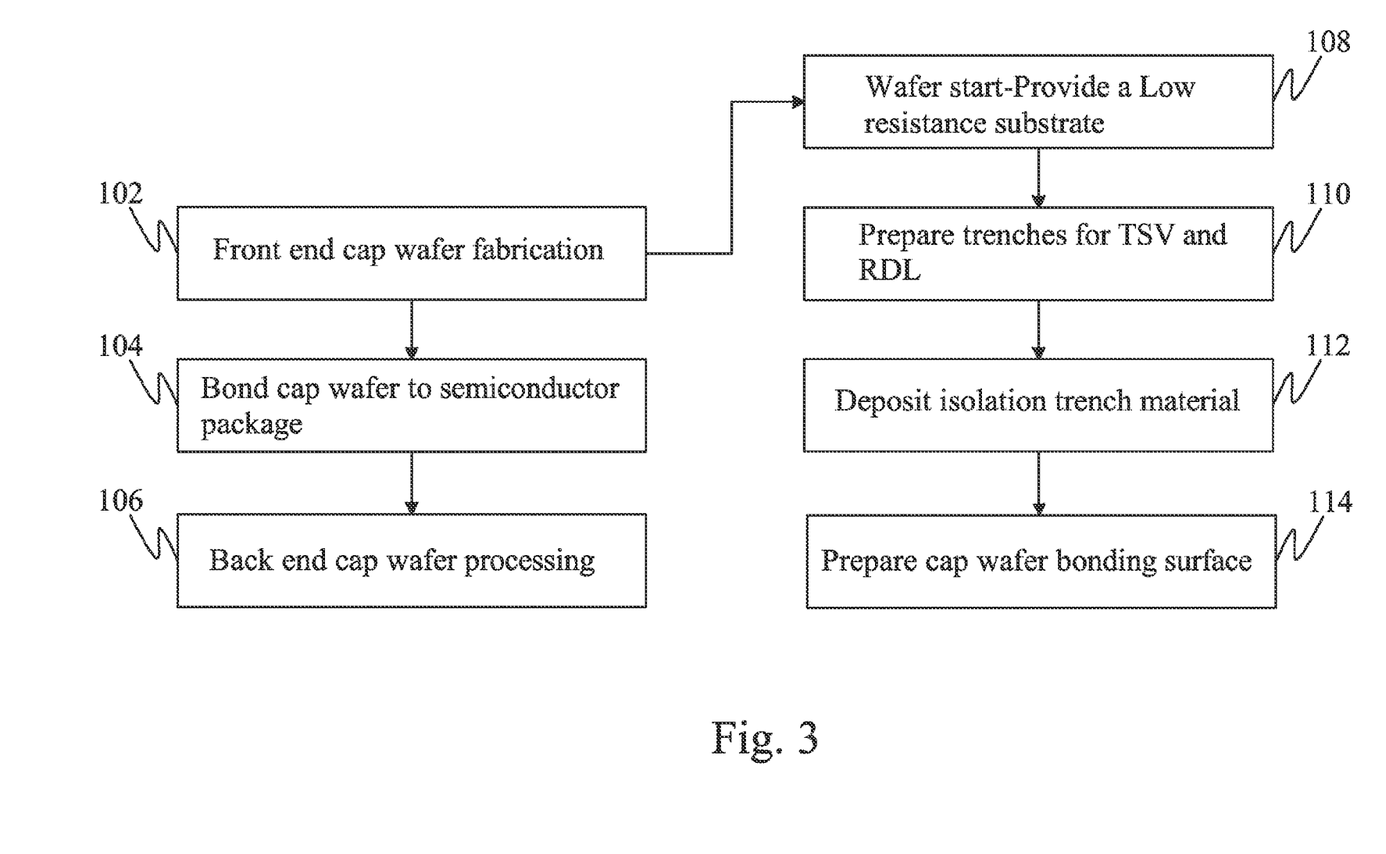
FIG. 3 is a process flow chart depicting another example method for generating a semiconductor structure having a TSV and a RDL fabricated together in a low resistance wafer that is bonded to an underlying semiconductor device, in accordance with some embodiments.

FIG. 3 is a process flow chart depicting another example method for generating a semiconductor structure having a TSV and a RDL fabricated together in a low resistance wafer that is bonded to an underlying semiconductor device. This example method includes operations similar to that of the example method of FIG. 2, but also illustrates example operations for front end cap wafer fabrication. In this example, a low resistance wafer is provided (operation 108). Isolation trenches are prepared in the silicon wafer to define and bound a TSV pillar and a RDL path (operation 110). Appropriate isolation trench material is provided in the trenches such as poly-Si and $SiO_2$ (operation 112). The cap wafer bonding surface is then prepared (operation 114).

Figure 4:
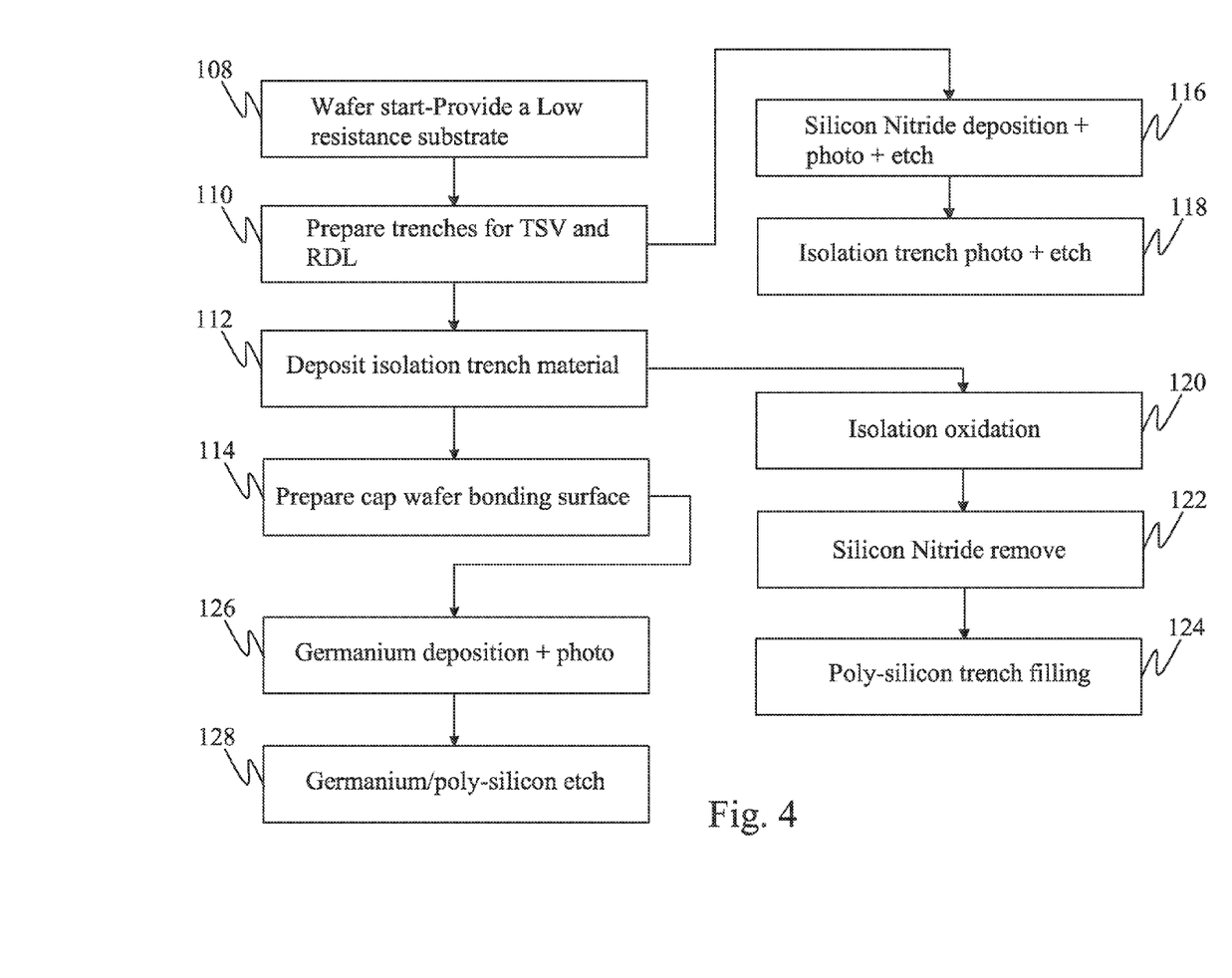
FIG. 4 is a process flow chart depicting an example method for front end cap wafer fabrication, in accordance with some embodiments.

FIG. 4 is a process flow chart depicting an example method for front end cap wafer fabrication. This example method includes operations similar to that of the example method of FIG. 3, but also illustrates example operations for preparing trenches, depositing trench material, and preparing the bonding surface. Preparing trenches that isolate the TSV and RDL locations on the wafer, in this example, involves silicon nitride deposition, photolithography and etching using a first mask (operation 116) and isolation trench photo lithography and etching using a second mask (operation 118) to define the layout of silicon nitride and the trenches, respectively, on the wafer.

After the trenches are formed, trench material is deposited in the trenches to isolate the TSV and RDL locations on the wafer (operation 112). First, in this example, thermal oxidation is performed to form an isolation oxide layer of about 1 μm to 1.5 μm on the silicon surface not covered by silicon nitride film (operation 120). Next, silicon nitride is removed so that the silicon surface of the Si pillar is exposed (operation 122) and poly-silicon is deposited (operation 124) to fill-up the isolation trench and at the same time make a good electrical contact with the Si-pillar which serves as the TSV.

After the trenches are filled, the cap wafer bonding surface is prepared (operation 114). Preparation may involve forming metal on the bottom surface (operation 126) to bond to metal on the semiconductor device to which the cap wafer is to be bonded. The metal formed on the bottom surface may be formed using a metal deposition operation such as Germanium (Ge) metal sputtering. Preparation also involves Germanium/poly-silicon photolithography and etching (e.g., using a third mask) (operation 128) to form a poly-silicon stand-off serving as a spacer between the cap wafer and underlying semiconductor device wafer.

Figure 5:
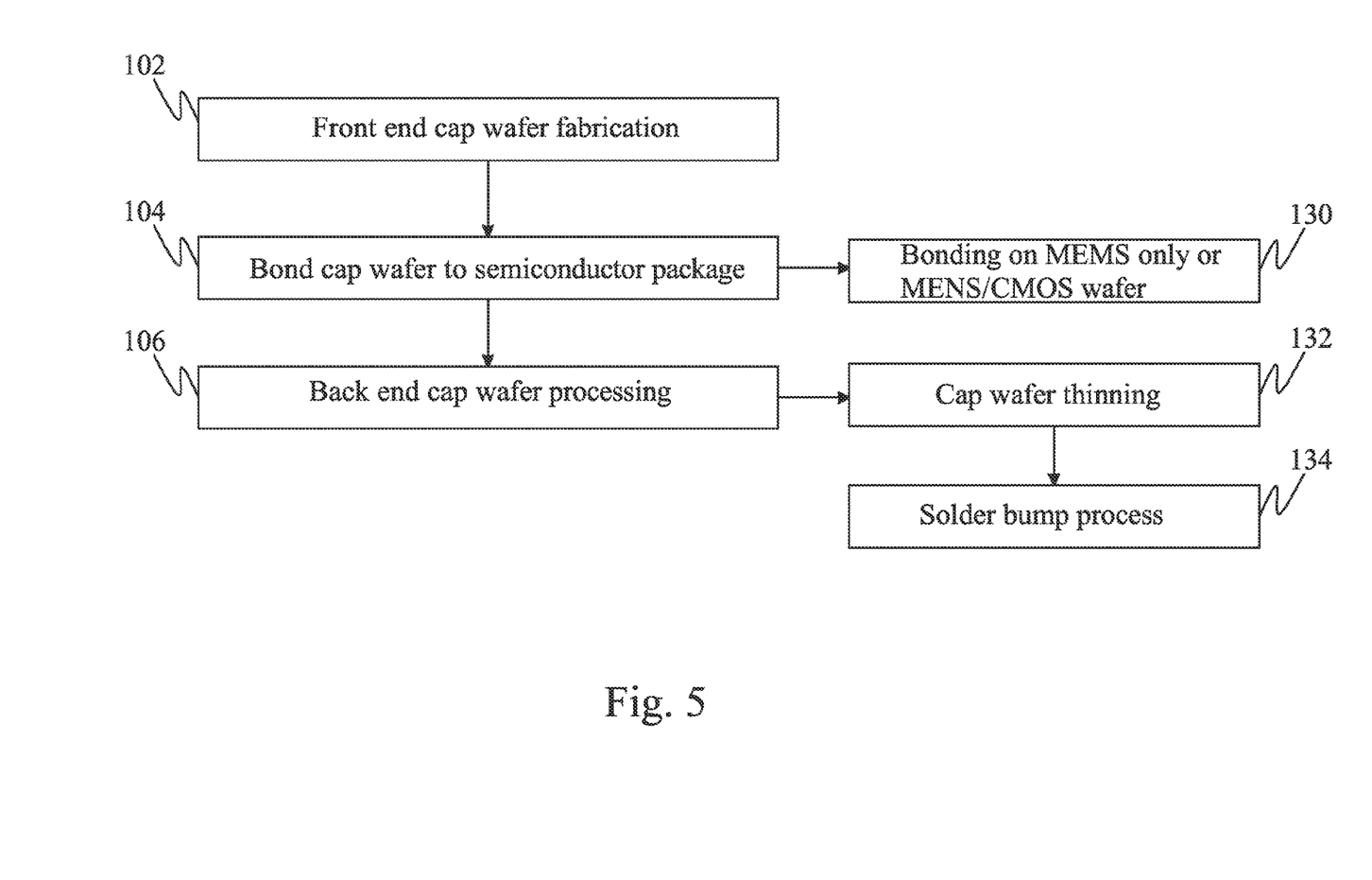
FIG. 5 is a process flow chart depicting another example method for generating a semiconductor structure having a TSV and a RDL fabricated together in a low resistance wafer that is bonded to an underlying semiconductor device, in accordance with some embodiments.

FIG. 5 is a process flow chart depicting another example method for generating a semiconductor structure having a TSV and a RDL fabricated together in a low resistance wafer that is bonded to an underlying semiconductor device. This example method comprises operations similar to that of the example method of FIG. 2, but also illustrates example operations for bonding a cap wafer to a semiconductor package and for performing back end cap wafer operations. In this example, bonding a cap wafer to a semiconductor package (operation 104) may involving bonding the cap wafer to a micro-electro-mechanical systems (MEMS) wafer or to a MEMS/CMOS wafer (operation 130). Back end cap wafer processing, in this example, involves operations to reduce the thickness (i.e., thinning) of the cap wafer (operation 132) through operations such as planarization. The cap wafer is thinned to a level such that the trenches that have been fabricated extend from the bonding surface of the cap wafer to the top surface of the wafer. Back end cap wafer processing, in this example, also involves providing a solder bump at an appropriate location on the top surface of the cap wafer (operation 134).

Figure 6:
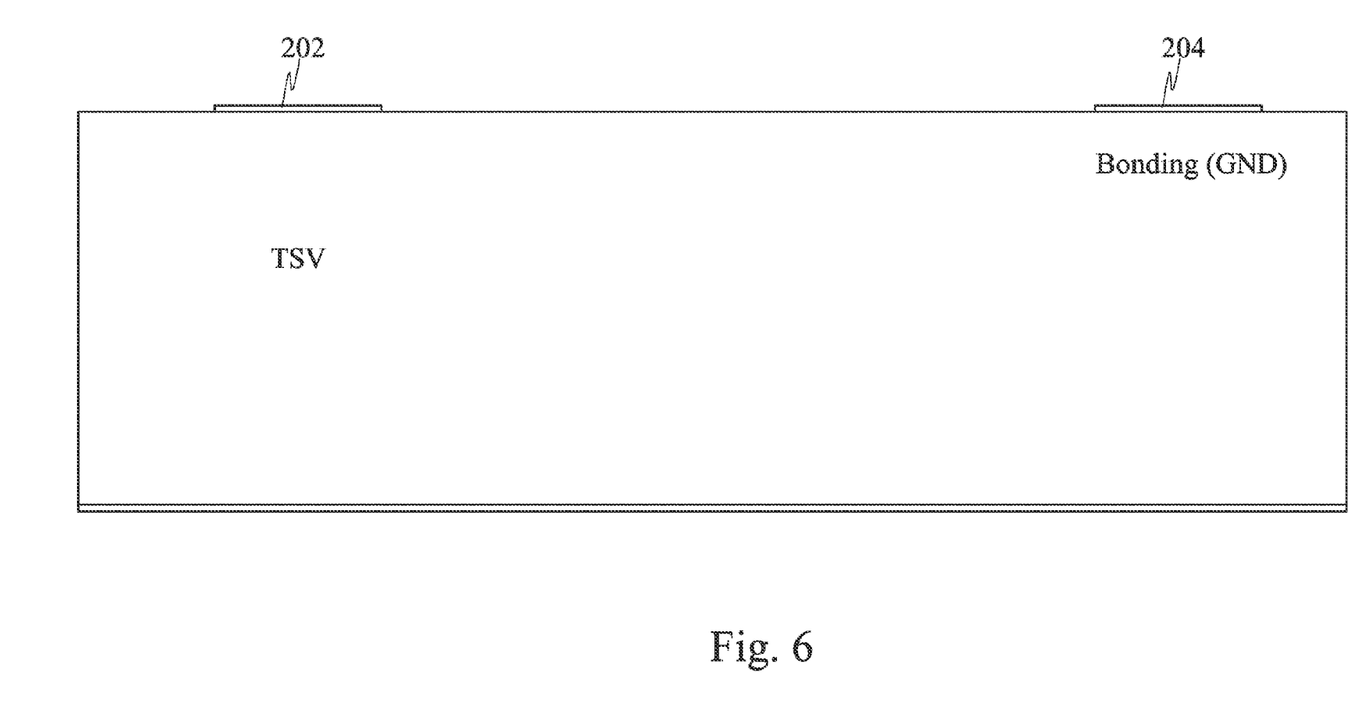
FIG. 6 is a cross sectional view of an example semiconductor wafer after silicon nitride deposition, photolithography and etching operations, in accordance with some embodiments.

FIG. 6 is a cross sectional view of the example semiconductor wafer 200 after silicon nitride deposition, photolithography and etching operations (e.g., operation 116 of FIG. 4) and prior to isolation trench photolithography and etching operations. Shown are deposited silicon nitride regions 202 and 204.

Figure 7A:
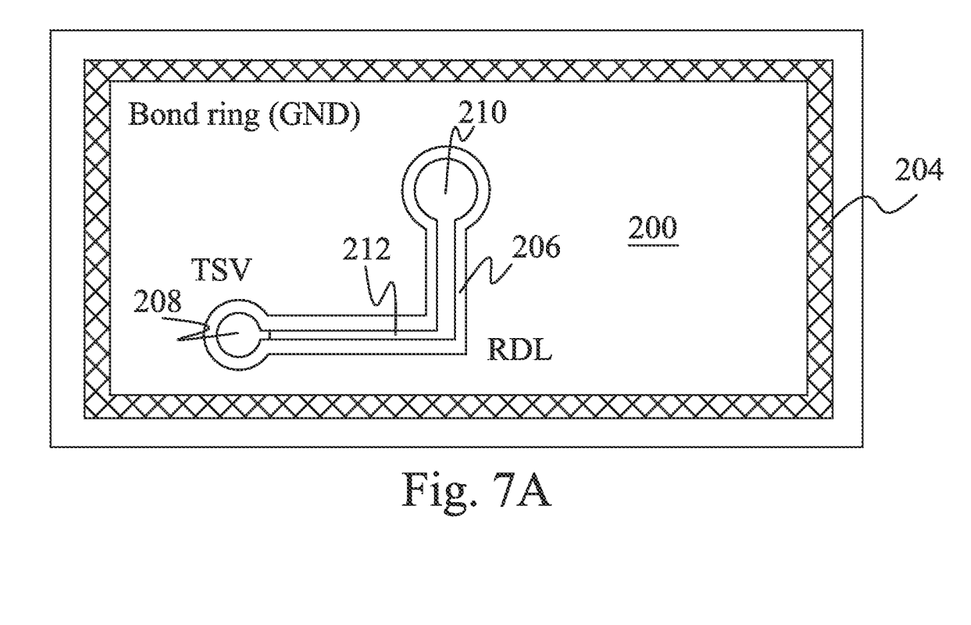
FIG. 7A is a top view of an example semiconductor wafer after isolation trench photolithography and etching operations, in accordance with some embodiments.
Figure 7B:
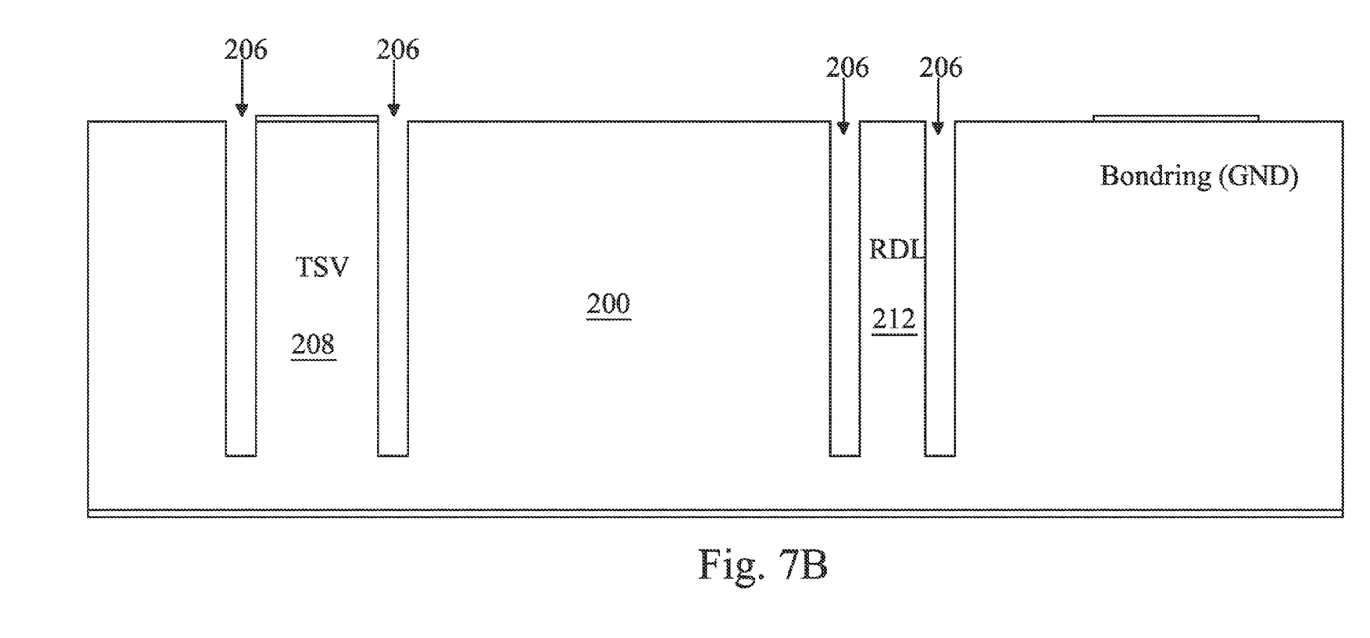
FIG. 7B is a cross sectional view of the example semiconductor wafer of FIG. 6A.

FIG. 7A is a top view of the example semiconductor wafer 200 after isolation trench photolithography and etching operations (operation 118 of FIG. 4). FIG. 7B is a cross sectional view of the example semiconductor wafer of FIG. 7A. Illustrated are isolation trenches 206, a pair of TSV locations 208, 210 and a RDL path 212.

Figure 8:
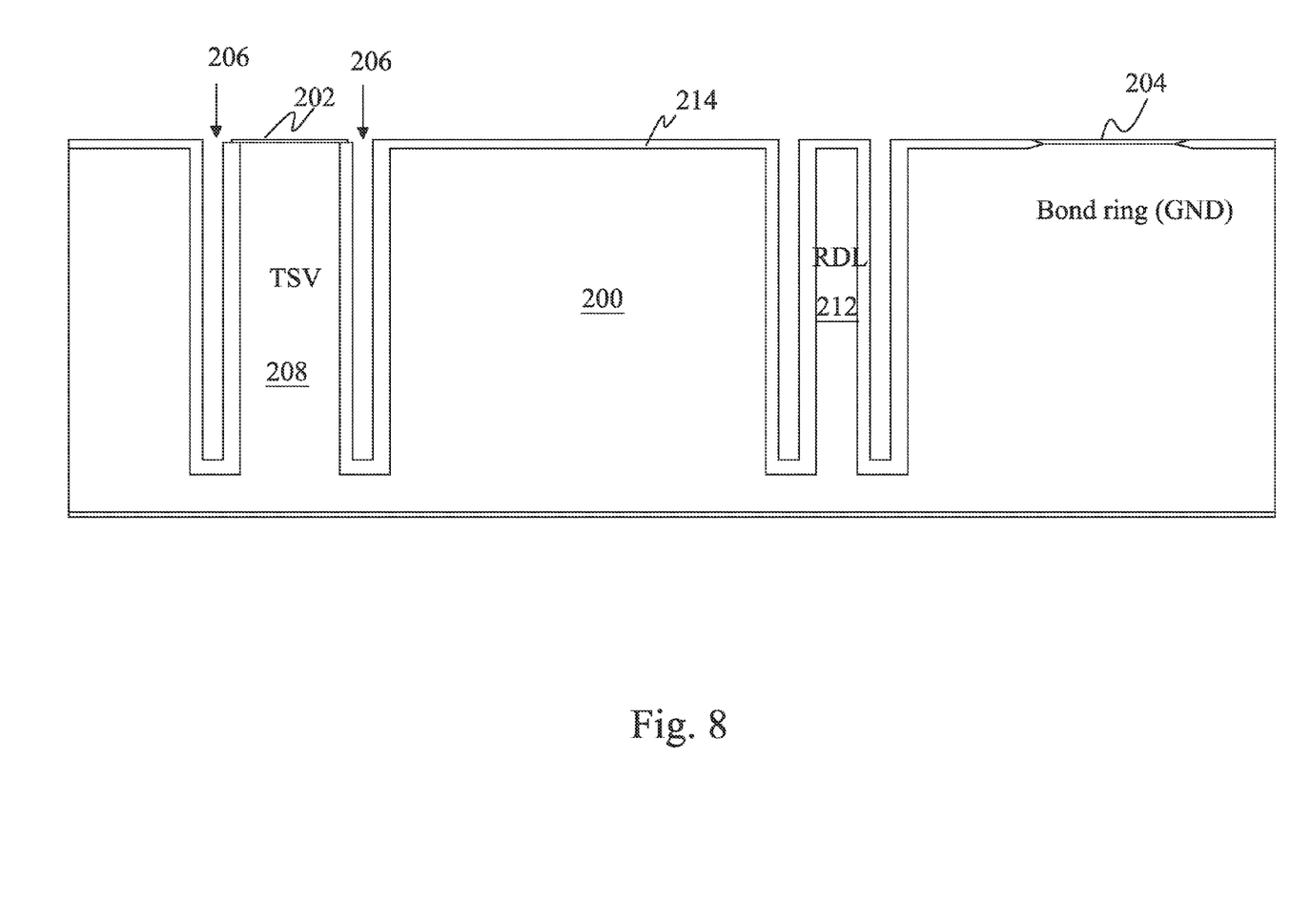
FIG. 8 is a cross sectional view of the example semiconductor wafer after isolation oxidation operations, in accordance with some embodiments.

FIG. 8 is a cross sectional view of the example semiconductor wafer 200 after isolation oxidation (operation 120 of FIG. 4), which may be accomplished using a furnace environment. Illustrated is a layer of oxidation 214 around the top surface of the wafer 200 and in the isolation trenches 206.

Figure 9:
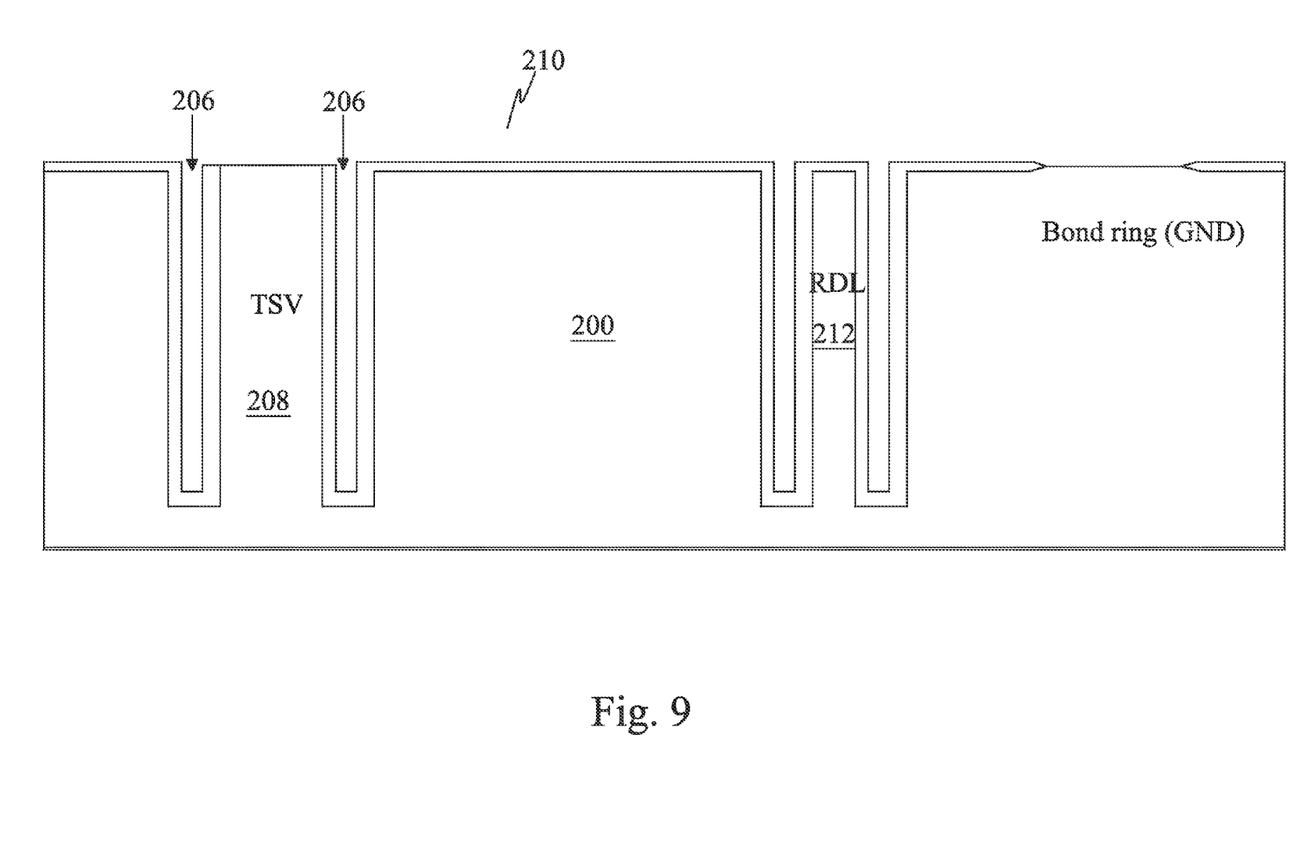
FIG. 9 is a cross sectional view of the example semiconductor wafer after silicon nitride removal operations, in accordance with some embodiments.

FIG. 9 is a cross sectional view of the example semiconductor wafer 200 after silicon nitride removal (operation 122 of FIG. 4), which may be accomplished, for example, using a reactive ion etching (RIE) process.

Figure 10:
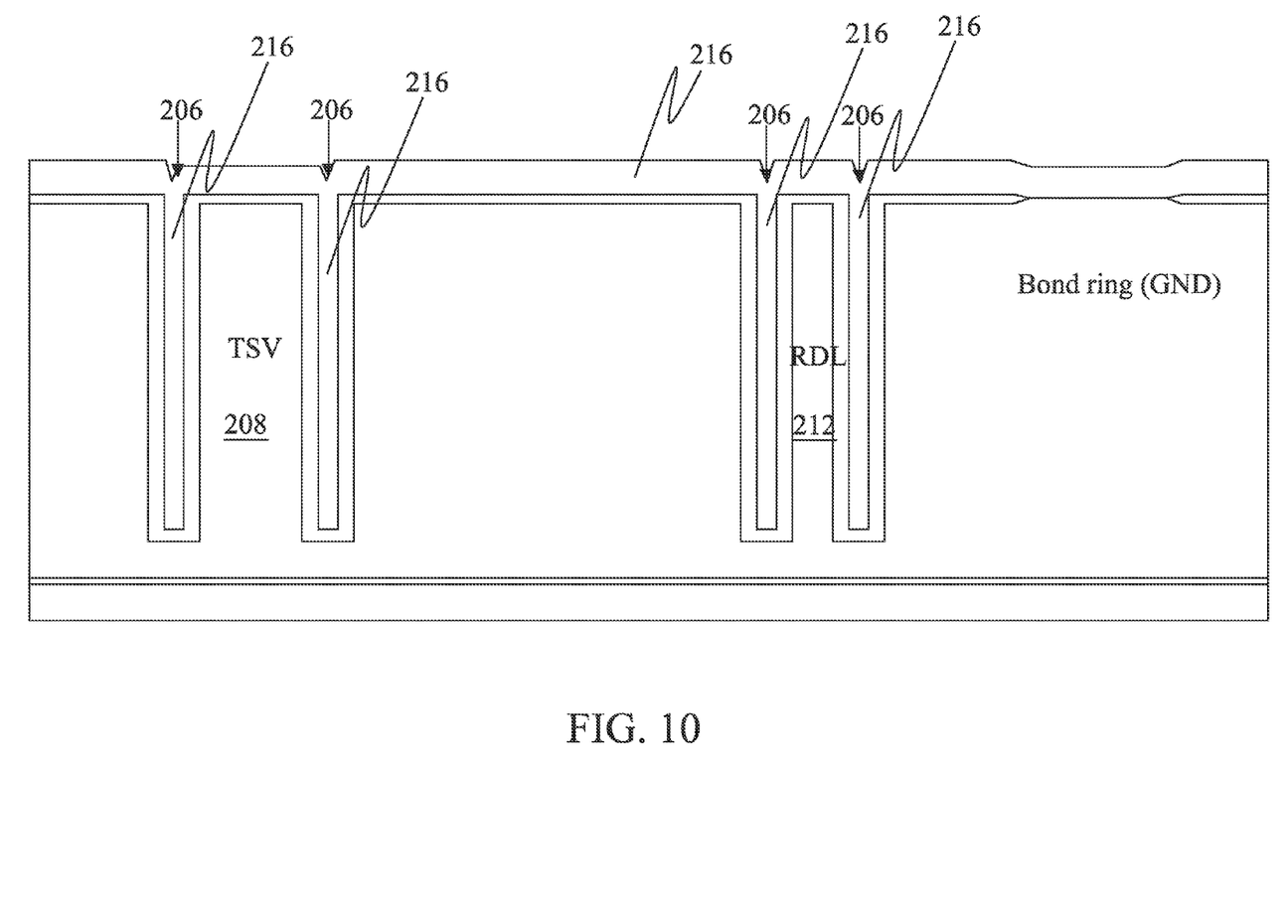
FIG. 10 is a cross sectional view of the example semiconductor wafer after trench filling operations, in accordance with some embodiments.

FIG. 10 is a cross sectional view of the example semiconductor wafer 200 after filling the trenches 206 with poly-silicon 216 (operation 124 of FIG. 4). The poly-silicon 216 has the same doping type as the semiconductor wafer 200 and may be applied using, for example, a chemical vapor deposition (CVD) process. Illustrated is a 4 μm layer of poly-silicon deposited in the trenches 206.

Figure 11:
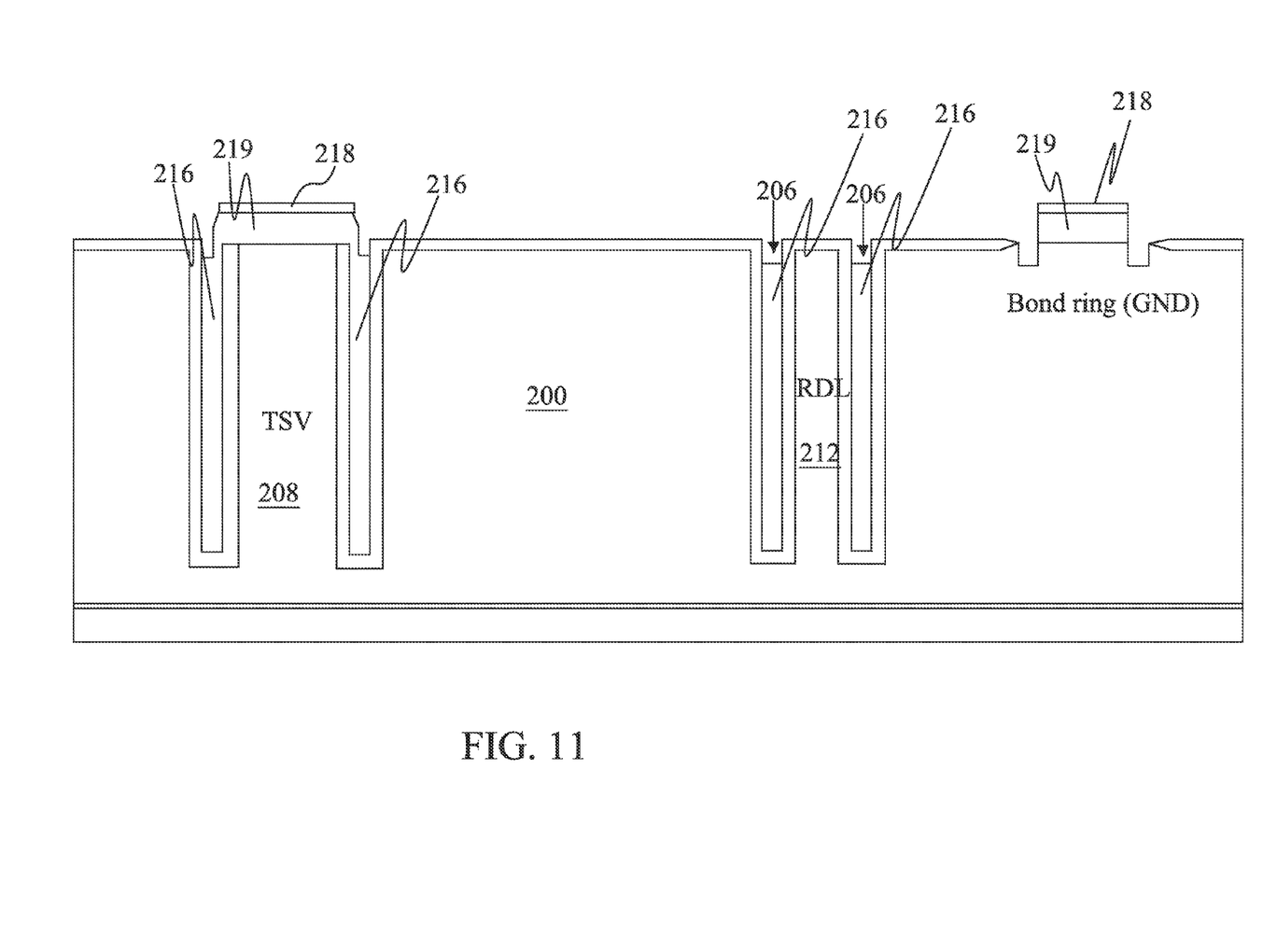
FIG. 11 is a cross sectional view of the example semiconductor wafer after metal formation operations, in accordance with some embodiments.

FIG. 11 is a cross sectional view of the example semiconductor wafer 200 after formation of metal 218 at open sections of the wafer (operations 126 and 128 of FIG. 4). The metal formation in this example involves Ge patterning and poly-silicon patterning (e.g., to form poly-silicon stand-offs 219) at the same time using operations such as photolithography, deposition, and etching operations. The poly-silicon stand-off 219 is physically and electrically connected to the poly-silicon in the isolation trench 216, serving as an electrical conduction path in parallel with the TSV 208.

Figure 12:
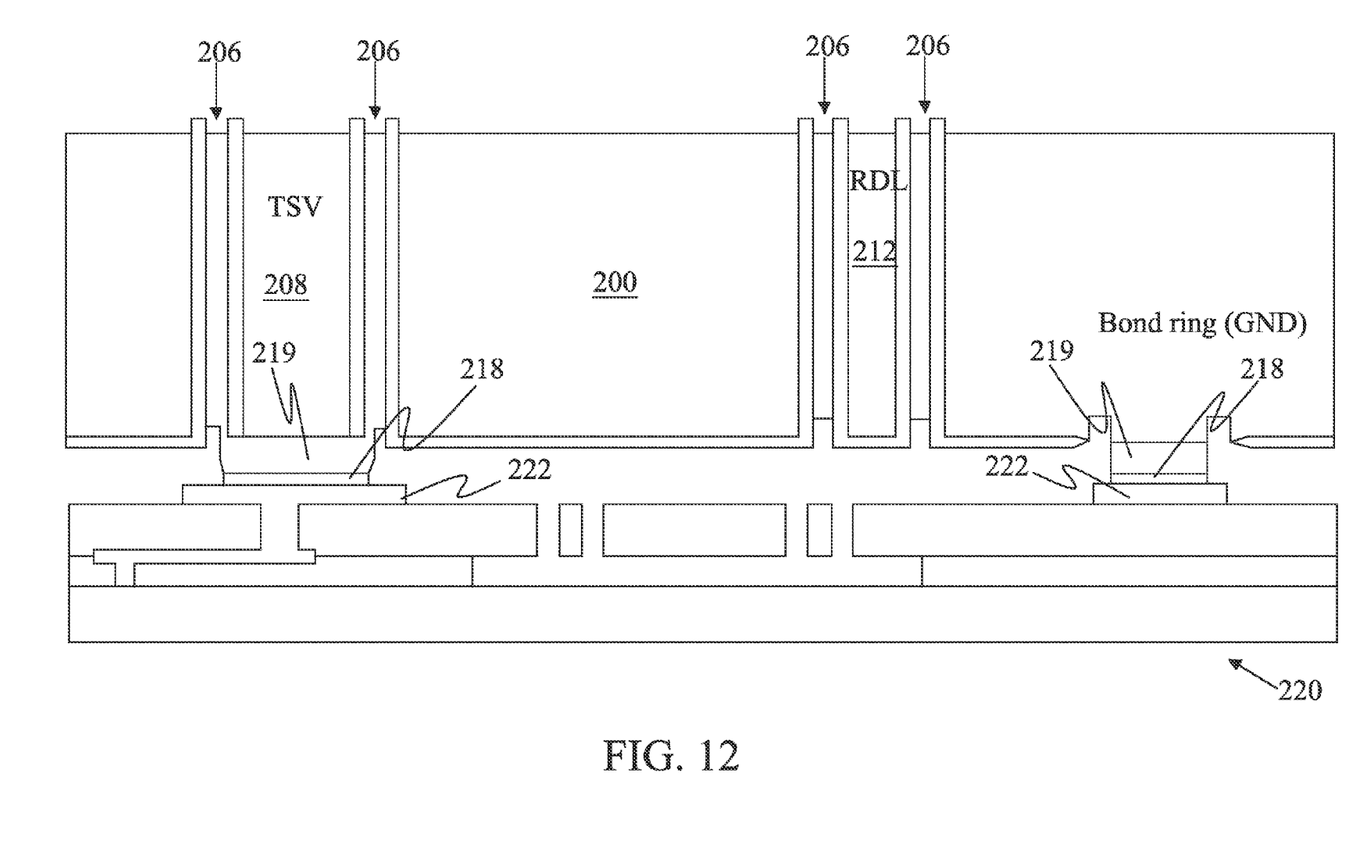
FIG. 12 is a cross sectional view of the example semiconductor wafer after wafer bonding operations, in accordance with some embodiments.

FIG. 12 is a cross sectional view of the example semiconductor wafer 200 after the wafer 200 is bonded to a semiconductor package 220 (operation 130 of FIG. 5) and wafer thinning operations (operation 132 of FIG. 5). In this example, the Ge 218 is bonded to metal connection points 222 on the semiconductor package 220. The metal connection points 222 in this example are made of metal material such as aluminum-copper (AlCu). The semiconductor package 218 may comprise different configurations such as a MEMS package or a MEMS package mounted on a CMOS package.

Figure 13A:
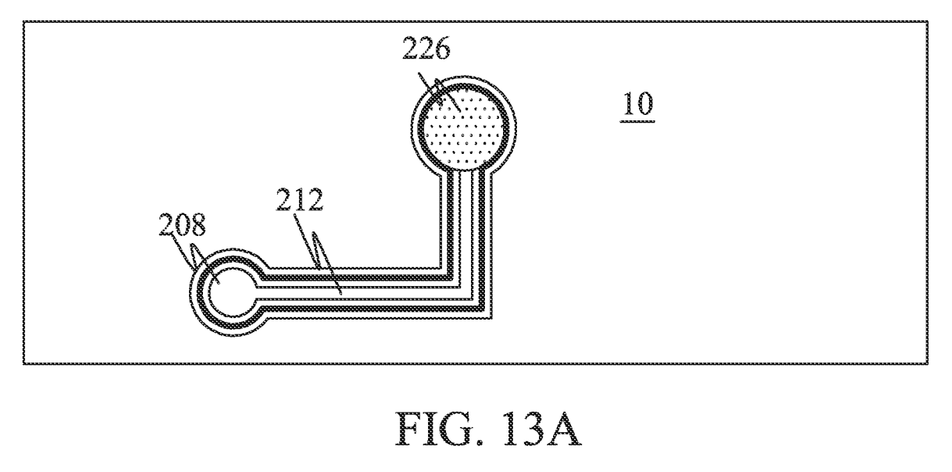
FIG. 13A is a top view and FIG. 13B is a cross sectional view of the example semiconductor wafer after wafer thinning operations and the application of a solder bump process, in accordance with some embodiments.
Figure 13B:
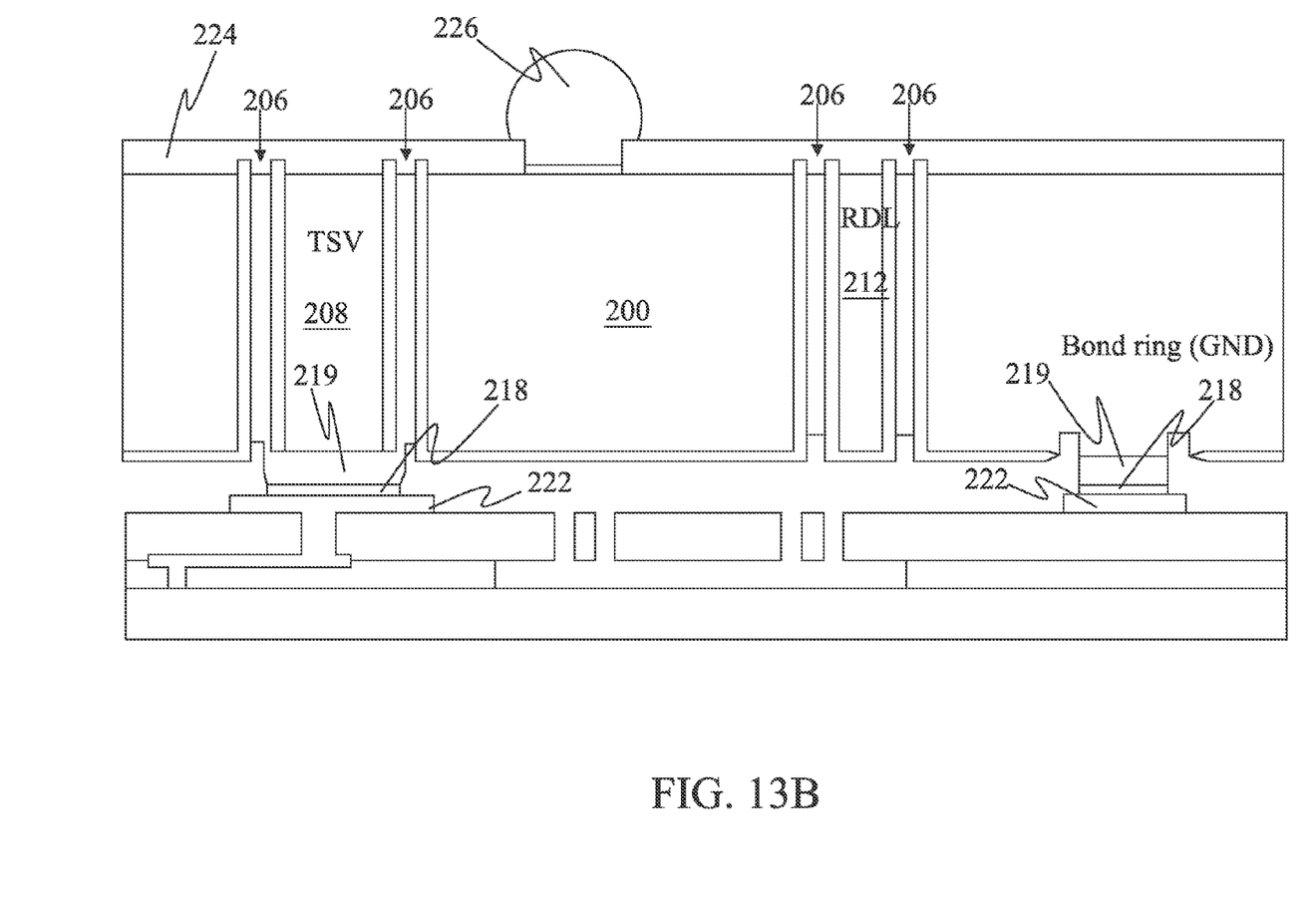

FIG. 13A is a top view and FIG. 13B is a cross sectional view of the example semiconductor wafer 200 after dielectric deposition and a solder bump application process (operation 134 of FIG. 5). Illustrated are a through-silicon via (TSV) 208, a RDL path 212, a dielectric 224, and a solder bump 226 (the dielectric is not shown in FIG. 13A).

The foregoing describes methods for constructing a TSV with a small via footprint and also to fabricate a TSV and a RDL at the same time. These methods may be utilized in wafer level chip scale package (WLCSP) technology to achieve a lower fabrication cost and a smaller die size.

In one embodiment, disclosed is a method of providing a redistribution layer (RDL) and a through-silicon via (TSV) for a semiconductor package. The method comprises preparing a wafer for bonding to a semiconductor package and bonding the wafer to the semiconductor package. The wafer comprises a low resistance substrate containing a RDL and a TSV for making an input/output (I/O) connection point of the semiconductor package available at another location. The RDL comprises a conduction path through the low resistance substrate that is bounded on two sides by an isolation trench. The TSV is bounded by the isolation trench and the RDL.

These aspects and other embodiments may include one or more of the following features. Preparing the wafer may comprise preparing an isolation trench that bounds the conduction path for the RDL through the low resistance substrate and bounds a vertical conduction path in a pillar for the TSV in the low resistance substrate. Preparing the wafer may further comprise filling the isolation trench with isolation trench material and preparing a wafer bonding surface. Preparing an isolation trench may comprise photolithography and etching operations. Filling the isolation trench with isolation trench material may comprise oxidation operations and poly trench filling operations. The isolation trench material may comprise poly-silicon material bounded by an oxide. Preparing the wafer bonding surface may comprise providing a first metal surface for bonding to a metal surface associated with the semiconductor package. Providing a first metal surface may comprise metal and poly-silicon patterning operations. The first metal surface may comprise Germanium (Ge). The method may further comprise forming a stand-off to serve as both a spacer and an electrical conduction path between the wafer and the semiconductor package. The stand-off may be a poly-silicon stand-off with the same doping type as the substrate. The bonding the wafer to the semiconductor package may comprise bonding the wafer to a MEMS or MEMS/CMOS wafer. The method may further comprise thinning the wafer to allow the isolation trench to extend through the thickness of the wafer from a top surface to a bottom surface. The thinning the wafer may be performed after the wafer is bonded to the semiconductor package.

In another embodiment, disclosed is a structure for providing a semiconductor package with a redistribution layer (RDL) and a through-silicon via (TSV). The structure comprises a low resistance substrate, a conductive RDL path through the low resistance substrate that is bounded by an isolation trench, and a TSV pillar formed in the substrate that extends from a top surface to a bottom surface of the substrate and that is bounded by a curved section of the isolation trench. The isolation trench has been at least partially filled with non-conductive material that electrically isolates sections of the low resistance substrate that are on opposite sides of the isolation trench and poly-silicon. The structure further comprises a poly-silicon stand-off physically and electrically connected to both the TSV pillar and the poly-silicon in the isolation trench.

These aspects and other embodiments may include one or more of the following features. The structure may further comprise a solder bump on the top surface wherein the TSV and the RDL cooperate to make an I/O connection point of a system level PCB board to which the structure is mounted available at the solder bump. The structure may further comprise a bonding surface on a bottom surface for bonding with the semiconductor package. The bonding surface may include a first metal surface for bonding to a metal surface associated with the semiconductor package. The first metal surface may comprise Germanium (Ge). The bonding surface may define a poly-silicon stand-off serving as a spacer and an electrical conduction path between structures.

In yet another embodiment, disclosed is a semiconductor device comprising a semiconductor package and a wafer bonded to the semiconductor package. The wafer comprises a low resistance substrate and a conductive RDL path through the low resistance substrate that is bounded by an isolation trench. The isolation trench has been filled or partially filled with non-conductive material that electrically isolates sections of the low resistance substrate that are on opposite sides of the isolation trench and poly-silicon. The wafer further comprises a TSV pillar formed in the substrate that extends from a top surface to a bottom surface of the substrate and that is bounded by a curved section of the trench. The wafer further comprises a poly-silicon stand-off physically and electrically connected to both the TSV pillar and the poly-silicon in the isolation trench.

These aspects and other embodiments may include one or more of the following features. The semiconductor device may further comprise a solder bump on a top surface of the wafer wherein the TSV and the RDL path cooperate to make an I/O connection point on the system level PCB board available at the solder bump. The semiconductor device may further comprise a bonding surface on a bottom surface of the wafer for bonding with the semiconductor package. The bonding surface may include a first metal surface for bonding to a metal surface associated with the semiconductor package The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of providing a redistribution layer (RDL) and a through-silicon via (TSV) for a semiconductor package, the method comprising:
    preparing a wafer for bonding to a semiconductor package, the wafer comprising a low resistance substrate containing the RDL and the TSV for making an input/output (I/O) connection point of the semiconductor package available at another location, wherein the RDL comprises a conduction path through the low resistance substrate that is bounded on two sides by an isolation trench, and wherein the TSV is bounded by the isolation trench and the RDL; and
    bonding the wafer to the semiconductor package.

2. The method of claim 1, wherein the preparing a wafer comprises:
    preparing the isolation trench that bounds the conduction path for the RDL through the low resistance substrate and bounds a vertical conduction path in a pillar for the TSV in the low resistance substrate;
    filling the isolation trench with isolation trench material; and
    preparing a wafer bonding surface.

3. The method of claim 2, wherein the preparing the isolation trench comprises photolithography and etching operations.

4. The method of claim 2, wherein the filling the isolation trench with isolation trench material comprises oxidation operations, silicon nitride removal operations, and poly trench filling operations.

5. The method of claim 4, wherein the isolation trench material comprises poly-silicon material bounded by an oxide.

6. The method of claim 2, wherein the preparing the wafer bonding surface comprises providing a first metal surface for bonding to a metal surface associated with the semiconductor package.

7. The method of claim 6, wherein the providing a first metal surface comprises metal and poly-silicon patterning operations.

8. The method of claim 6, wherein the first metal surface comprises Germanium (Ge).

9. The method of claim 6, further comprising forming a stand-off to serve as both a spacer and an electrical conduction path between the wafer and the semiconductor package.

10. The method of claim 9, wherein the stand-off is a poly-silicon stand-off with the same doping type as the substrate.

11. The method of claim 1, wherein the bonding the wafer to the semiconductor package comprises bonding the wafer to a micro-electro-mechanical system (MEMS) or MEMS/CMOS wafer.

12. The method of claim 1, further comprising:
    thinning the wafer to allow the isolation trench to extend through the thickness of the wafer from a top surface to a bottom surface.

13. The method of claim 12, wherein the thinning the wafer is performed after the wafer is bonded to the semiconductor package.

14. A method for manufacturing a semiconductor device that includes a wafer, the method comprising:
    forming in the wafer an isolation trench that isolates a first section of the wafer from a second section of the wafer;
    forming non-conductive material in the isolation trench to partially fill the isolation trench;
    forming poly-silicon on the non-conductive material to substantially fill the isolation trench;
    forming a stand-off that includes poly-silicon and that is connected to the first section of the wafer and the poly-silicon in the isolation trench; and
    forming metal on the poly-silicon of the stand-off.

15. The method of claim 14, the semiconductor device further including a semiconductor package, the method further comprising connecting the metal to the semiconductor package.

16. A method for manufacturing a semiconductor device that includes a wafer, the method comprising:
    forming in the wafer an isolation trench that isolates a first section of the wafer from a second section of the wafer;
    substantially filling the isolation trench with isolation trench material that includes poly-silicon;
    forming on a first surface of the wafer a stand-off that includes poly-silicon and that is connected to the first section of the wafer and the poly-silicon in the isolation trench;
    forming metal on the poly-silicon of the stand-off;
    thinning the wafer to allow the isolation trench to extend to a second surface of the wafer opposite to the first surface of the wafer; and
    forming on the second surface of the wafer a solder bump that is connected to the first section of the wafer.

17. A method for manufacturing a semiconductor device that includes a wafer, the wafer having a first section, a second section, an isolation trench that isolates the first and second sections from each other, and an isolation trench material that substantially fills the isolation trench and that includes poly-silicon, the method comprising:
    forming on a first surface of the wafer a stand-off that includes poly-silicon and that is connected to the first section of the wafer and the poly-silicon in the isolation trench;
    forming metal on the poly-silicon of the stand-off;
    thinning the wafer to allow the isolation trench to extend to a second surface of the wafer opposite to the first surface of the wafer; and
    forming on the second surface of the wafer a solder bump that is connected to the first section of the wafer.

18. The method of claim 17, the semiconductor device further including a semiconductor package, the method further comprising connecting the metal to the semiconductor package.

* * * * *